United States Patent
Bhatia et al.

(10) Patent No.: US 10,755,903 B2
(45) Date of Patent: Aug. 25, 2020

(54) RPS DEFECT REDUCTION BY CYCLIC CLEAN INDUCED RPS COOLING

(71) Applicant: Applied Materials, Inc., Santa Clara, CA (US)

(72) Inventors: Sidharth Bhatia, Santa Cruz, CA (US); Zhili Zuo, Santa Clara, CA (US); Hidehiro Kojiri, Sunnyvale, CA (US); Anjana M. Patel, San Jose, CA (US); Song-Moon Suh, Sunnyvale, CA (US); Ganesh Balasubramanian, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 145 days.

(21) Appl. No.: 15/397,883

(22) Filed: Jan. 4, 2017

(65) Prior Publication Data

US 2017/0207069 A1    Jul. 20, 2017

Related U.S. Application Data

(60) Provisional application No. 62/279,055, filed on Jan. 15, 2016.

(51) Int. Cl.
| | |
|---|---|
| *B08B 9/00* | (2006.01) |
| *B08B 5/00* | (2006.01) |
| *H01J 9/38* | (2006.01) |
| *H01J 37/32* | (2006.01) |
| *C23C 16/44* | (2006.01) |

(52) U.S. Cl.
CPC ......... *H01J 37/32862* (2013.01); *B08B 5/00* (2013.01); *B08B 9/00* (2013.01); *C23C 16/4405* (2013.01); *C23C 16/4411* (2013.01); *H01J 37/3244* (2013.01); *H01J 37/32357* (2013.01); *H01J 37/32522* (2013.01); *H01J 2237/002* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,271,963 A | * | 12/1993 | Eichman | C23C 16/34 118/719 |
| 6,274,058 B1 | * | 8/2001 | Rajagopalan | C23C 16/4405 134/22.1 |
| 6,274,068 B1 | * | 8/2001 | Dimmit | C07C 45/68 260/665 G |
| 6,843,858 B2 | * | 1/2005 | Rossman | B08B 7/0035 134/1.1 |
| 2005/0257890 A1 | * | 11/2005 | Park | H01J 37/32192 156/345.35 |
| 2008/0317975 A1 | * | 12/2008 | Furui | H01J 37/32862 427/575 |
| 2013/0061871 A1 | * | 3/2013 | Collins | B08B 7/00 134/1.1 |
| 2016/0314944 A1 | | 10/2016 | Bhatia et al. | |

* cited by examiner

*Primary Examiner* — Katelyn B Whatley
(74) *Attorney, Agent, or Firm* — Patterson + Sheridan, LLP

(57) ABSTRACT

A method of cleaning a remote plasma source includes supplying a first cycle of one or more first cleaning gases to a remote plasma source. The method includes supplying a second cycle of one or more second cleaning gases to the remote plasma source. The method includes supplying one or more cooling fluids to one or more cooling conduits coupled with the remote plasma source.

20 Claims, 6 Drawing Sheets

RPS DEFECT REDUCTION BY CYCLIC CLEAN INDUCED RPS COOLING

CROSS-REFERENCE TO RELATED APPLICATIONS

This application claims benefit of U.S. Provisional Patent Application No. 62/279,055, filed Jan. 15, 2016, which is incorporated by reference in its entirety.

FIELD

Implementations of the present disclosure generally relate to cleaning of chemical vapor deposition apparatus.

BACKGROUND

During chemical vapor deposition (CVD) of silicon oxide and other layers onto the surface of a substrate, the deposition gases released inside the processing chamber may cause unwanted deposition on areas such as the walls of the processing chamber. Unless removed, this unwanted deposition is a source of defects, e.g. particles, that may interfere with subsequent processing and adversely affect wafer yield.

To avoid such problems, the inside surface of the chamber is regularly cleaned to remove the unwanted deposition material from the chamber walls and similar areas of the processing chamber. This procedure may be performed as a standard chamber dry clean operation where an etchant gas is used to remove (etch) the deposited material from the chamber wall and other areas. During the dry clean operation, the chamber interior is exposed to a plasma from the etchant gas so that the etchant gas reacts with and removes the deposited material from the chamber walls. Such cleaning procedures may be performed between deposition steps for every wafer or every n wafers.

However, typical cleaning procedures have inherent setbacks. CVD chambers are typically equipped with a remote plasma source (RPS) to enable a radical based clean after chemical vapor deposition. In some systems, an RPS can also be a source for radicals that participate in film formation itself. The lifetime of the RPS unit is governed by the integrity of an internal surface layer. During a typical RPS/chamber cleaning process, internal surfaces of the RPS/chamber can undergo thermal shock due to the high temperatures (and large temperature variations) of a typical cleaning process. Thermal shock of an internal surface leads to crazing and flaking of one or more of the internal surfaces. Flaking of internal surfaces of an RPS/chamber results in defects present on other internal surfaces of an RPS/chamber and/or a substrate within the chamber. Defects include fluorine-containing aluminum (Al—F), fluorine-containing aluminum oxide (Al—O—F), hydrogen-containing aluminum (Al—H), and hydrogen-containing aluminum oxide (Al—O—H). Crazing and flaking also cause severe plasma arcing in the RPS and RPS block. Therefore, there is a need in the art for improved RPS/chamber cleaning processes that reduce the occurrence of thermal shock in an RPS/chamber.

SUMMARY

In some implementations, a method of cleaning a remote plasma source includes supplying a first cycle of one or more first cleaning gases to a remote plasma source. The method further includes supplying a second cycle of one or more second cleaning gases to the remote plasma source. The method also includes supplying one or more cooling fluids to one or more cooling conduits coupled with the remote plasma source.

BRIEF DESCRIPTION OF THE DRAWINGS

So that the manner in which the above recited features of the present disclosure can be understood in detail, a more particular description of the subject matter, briefly summarized above, may be had by reference to implementations, some of which are illustrated in the appended drawings. It is to be noted, however, that the appended drawings illustrate only typical implementations of the present disclosure and are therefore not to be considered limiting of its scope, for the claimed subject matter may admit to other equally effective implementations.

Figure 1:
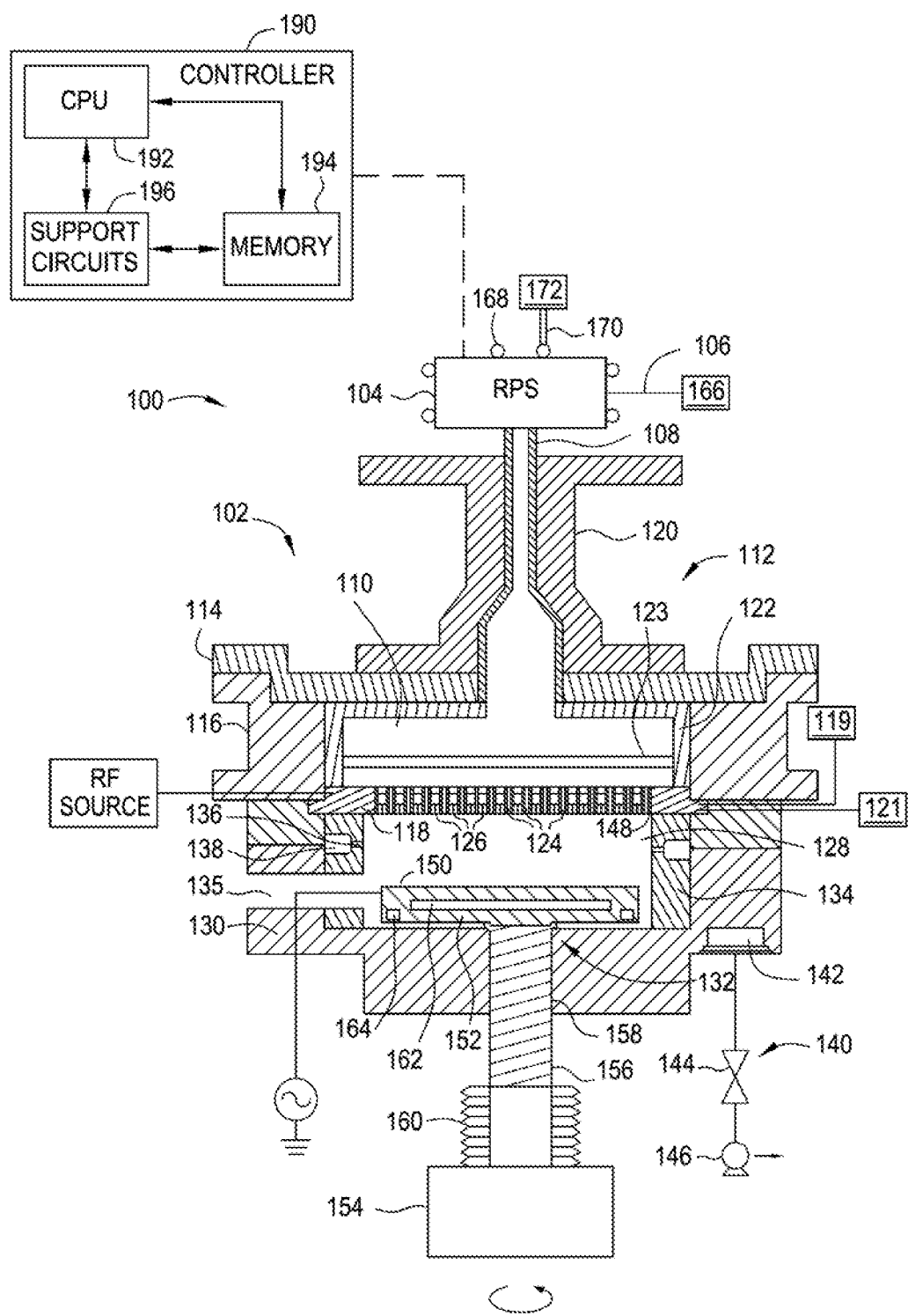
FIG. 1 is a cross sectional view of an apparatus 100 for film deposition according to some implementations.

To facilitate understanding, identical reference numerals have been used, where possible, to designate identical elements that are common to the figures. It is contemplated that elements disclosed in one implementation may be beneficially utilized on other implementations without specific recitation. The drawings referred to here should not be understood as being drawn to scale unless specifically noted. Also, the drawings are often simplified and details or components omitted for clarity of presentation and explanation. The drawings and discussion serve to explain principles discussed below.

DETAILED DESCRIPTION

In the following description, for purposes of explanation, numerous specific details are set forth in order to provide a thorough understanding of the implementations provided herein. However, it will be evident to one skilled in the art that the present disclosure may be practiced without these specific details. In other instances, specific apparatus structures have not been described so as not to obscure implementations described. The following description and figures are illustrative of the implementations and are not to be construed as limiting the claimed subject matter.

Methods of cleaning a remote plasma source coupled to a chemical vapor deposition (CVD) chamber are disclosed. In some implementations, a method includes a cyclic cleaning of the remote plasma source and/or chamber. In a cyclic cleaning, the cleaning may be performed at shorter time durations (as compared to a continuous clean). For example, a cyclic cleaning may be performed for about 250 seconds or less, such as about 100 seconds or less, or such as about 50 seconds or less.

In some implementations, a cyclic cleaning is performed such that the remote plasma source is maintained at a temperature below about 150° C., such as below about 100° C., during a cyclic cleaning, and the change in temperature (ΔT) of the remote plasma source during a cyclic cleaning may be between about 10° C. and about 25° C. The number of cycles may be between about 2 and about 15. Each cycle may be between about 5 seconds and about 90 seconds. Because of the lower temperature of the remote plasma source during a cyclic cleaning (as compared to a continuous clean), the remote plasma source has a temperature profile that is a cyclic steady state, where the RPS experiences less thermal shock of an internal surface layer of the RPS and less defect formation within the remote plasma source and the CVD chamber.

The flow rate and temperature of cooling fluid (such as water) through conduit(s) within and/or around the remote plasma source block allows control of the temperature of the remote plasma source during cyclic cleaning.

In some implementations, a flow rate of cooling fluid through conduit(s) within the remote plasma source block is between about 3 liters per minute (LPM) and about 15 LPM for a chamber configured to accept a 300 mm substrate, such as between about 1 gallon per minute and about 5 gallons per minute. A temperature of cooling fluid contacting the remote plasma source (via cooling conduit(s)) may be between about 10° C. and about 25° C. A temperature of cooling fluid exiting the cooling conduit(s) may be between about 10° C. and about 25° C. A supply pressure of cooling fluid through conduit(s) to the RPS may be between about 40 pounds per square inch (PSI) and about 50 PSI.

Following a cyclic clean, an RPS and/or CVD chamber may be seasoned. Seasoning the RPS and/or CVD chamber may include flowing a silicon-containing precursor into a remote plasma source to deposit a silicon containing film on an internal surface of the remote plasma source and/or chamber.

FIG. 1 is a cross sectional view of an apparatus 100 for film deposition according to an implementation. As shown in FIG. 1, the apparatus 100 includes a processing chamber 102 comprising a body 130 and a remote plasma source 104 coupled to body 130. Remote plasma source 104 may be any suitable source that is capable of generating plasma and/or radicals from process gases. Remote plasma source 104 may be a radio frequency (RF) or very high radio frequency (VHRF) capacitively coupled plasma (CCP) source, an inductively coupled plasma (ICP) source, a microwave induced (MW) plasma source, a DC glow discharge source, an electron cyclotron resonance (ECR) chamber, or a high density plasma (HDP) chamber. Alternatively, remote plasma source 104 may be an ultraviolet (UV) source or the filament of a hot wire chemical vapor deposition (HW-CVD) chamber. If remote plasma source 104 is a capacitively coupled remote plasma source, the plasma and/or radicals may be generated from an RF power of between about 50 W and about 15,000 W at 13.56 MHz for a 300 mm substrate, such as an RF power from about 2,000 W to about 10,000 W.

Remote plasma source 104 includes one or more gas inlets 106 for supplying one or more process gases (such as cleaning gases or seasoning gases) from gas source 166. One or more cooling conduits 168 is coupled with (within or adjacent to) remote plasma source 104 for temperature control of remote plasma source 104. One or more cooling conduits 168 include cooling fluid inlet(s) 170 for supplying cooling fluid from cooling fluid source 172 to cooling fluid conduit(s) 168. Remote plasma source 104 may be coupled to the processing chamber 102 by a conduit 108.

One or more process gases, which may be a cleaning gas mixture, may enter remote plasma source 104 via the one or more gas inlets 106. The one or more process gases may comprise an oxygen-containing and/or nitrogen-containing gas, such as oxygen, $H_2O$, hydrogen peroxide, and/or ammonia. Alternatively or in addition to the oxygen-containing and/or nitrogen-containing gases, the process gases may comprise a fluorine gas, such as $F_2$, $NF_3$, $SF_6$ and fluorocarbons, such as $CHF_3$, $CF_4$, $O_4F_6$, $C_3F_8$ and $C_5F_8$.

One or more process gases may comprise a deposition gas having a silicon-containing gas. Examples of the silicon-containing gas include organosilicon, tetraalkyl orthosilicate gases and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more precursor gases may be (dimethylsilyl)(trimethylsilyl)methane $((Me)_3SiCH_2SiH(Me)_2)$, hexamethyl-disilane $((Me)_3SiSi(Me)_3)$, trimethylsilane $((Me)_3SiH)$, trimethylsilylchloride $((Me)_3SiCl)$, tetramethylsilane $((Me)_4Si)$, tetraethoxysilane $((EtO)_4Si)$, tetramethoxysilane $((MeO)_4Si)$, tetrakis(trimethyl-silyl)silane $((Me_3Si)_4Si)$, (dimethylamino)dimethylsilane $((Me_2N)SiHMe_2)$, dimethyldiethoxysilane $((EtO)_2Si(Me)_2)$, dimethyldimethoxysilane $((MeO)_2Si-(Me)_2)$, methyltrimethoxy-silane $((MeO)_3Si(Me))$, dimethoxytetramethyldisiloxane $((Me)_2Si(OMe))_2O)$, tris(dimethylamino)silane $((Me_2N)_3SiH)$, bis(dimethylamino)methylsilane $((Me_2N)_2CH_3SiH)$, disiloxane $((SiH_3)_2O)$, and combinations thereof.

In some implementations, films may be formed by, for example, flowable CVD onto a substrate. Such films may include but are not limited to silicon-containing films. For example, a film may be deposited that is composed of SiC, SiO, SiCN, $SiO_2$, SiOC, SiOCN, SiON and/or SiN. The composition of the films depends on the composition of the deposition gases. SiC films may be deposited, for example, by using (dimethyl-silyl)(trimethylsilyl)methane, hexamethyldisilane, and/or trimethylsilane. $SiO/SiO_2$ films may be deposited, for example, by using TEOS and/or disiloxane. SiCN films may be deposited, for example, by using tris(dimethylamino)silane, bis(dimethylamino)methylsilane, and/or (dimethyl-amino)dimethylsilane. SiOC films may be deposited, for example, by using tris(dimethylamino)silane, bis(dimethylamino)methylsilane, (dimethylamino)-dimethylsilane, tris(dimethylamino)silane, bis(dimethyl-amino)methylsilane, and/or (dimethylamino)dimethylsilane. SiOCN films can be formed, for example, by using tris(dimethylamino)silane, bis(dimethylamino)methylsilane, and/or (dimethylamino)dimethylsilane. SiON films can be formed, for example, by using disiloxane or trisilylamine. SiN films may be deposited, for example, by using trisilylamine (TSA) and/or silane.

The one or more process gases may comprise an inert gas, such as argon, helium, and/or nitrogen (e.g., $N_2$). Process gases may form a plasma in remote plasma source 104 and travel into processing chamber 102 through radical conduit 108.

The radical conduit 108 is a part of a lid assembly 112, which also includes a plasma cavity 110, a top plate 114, a lid rim 116, and a dual-channel showerhead 118. An internal surface of the remote plasma source 104 and/or the radical conduit 108 may comprise a material that is substantially unreactive to plasma and radicals. For example, an internal surface of remote plasma source 104 and/or conduit 108 may comprise AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. A representative example of a suitable $SiO_2$ material is quartz. Alternatively or additionally, remote plasma source 104 and/or radical conduit 108 may have a coating on the surface that contacts the plasma and/or radicals in operation. The coating may also comprise AlN, SiO$_2$, Y$_2$O$_3$, MgO, anodized Al$_2$O$_3$, sapphire, ceramic containing one or more of Al$_2$O$_3$, sapphire, AlN, Y$_2$O$_3$, MgO, or plastic. If a coating is used, the thickness of the coating may be between about 1 μm and about 1 mm. The coating may be applied using a spray coating process. The radical conduit 108 may be disposed within and supported by a radical conduit support member 120. The radical conduit support member 120 may be disposed on top plate 114, which rests on lid rim 116.

Cavity 110 is positioned below and coupled to conduit 108, and the plasma and/or radicals generated in remote plasma source 104 travel to cavity 110 through the conduit 108. Directional terms used herein, such as "below", "upper", "lower", "top" or "bottom", etc., are relative to the apparatus 100 itself and are not an absolute direction. Cavity 110 is defined by top plate 114 coupled with lid rim 116 that is coupled with dual-channel showerhead 118. Cavity 110 may include a liner 122. Liner 122 may cover surfaces of top plate 114 and lid rim 116 that are within cavity 110. Liner 122 may comprise a material that is substantially unreactive to radicals. For example, liner 122 may comprise AlN, SiO$_2$, Y$_2$O$_3$, MgO, anodized Al$_2$O$_3$, sapphire, ceramic containing one or more of Al$_2$O$_3$, sapphire, AlN, Y$_2$O$_3$, MgO, or plastic. Alternatively or in addition to, the surfaces of radical cavity 110 that are in contact with plasma and/or radicals may be composed of or coated with a material that is substantially unreactive to plasma and/or radicals. For example, the surfaces may be composed of or coated with AlN, SiO$_2$, Y$_2$O$_3$, MgO, anodized Al$_2$O$_3$, sapphire, ceramic containing one or more of Al$_2$O$_3$, sapphire, AlN, Y$_2$O$_3$, MgO, or plastic. If a coating is used, the thickness of the coating may be between about 1 μm and about 1 mm. By not consuming the generated plasma and/or radicals, cleaning efficiency may be improved and the flux of plasma and/or radicals to a substrate disposed in the processing chamber 102 during a deposition is increased.

Distribution plate 123 may be an ion, radical and/or plasma filter, such as any suitable electrostatic filter, wire or mesh filter, or magnetic filter, used between top plate 114 and the dual-channel showerhead 118. Distribution plate 123 may be made of the same material as liner 122 or may be coated with the same material as liner 122. Distribution plate 123 may be used to control the plasma and/or radical flow profile. The location of distribution plate 123 in cavity 110, i.e., the distance between distribution plate 123 and top plate 114, and the distance between radical distribution plate 123 and dual-channel showerhead 118, may also be adjusted to affect plasma and/or radical distribution.

Distribution plate 123 may comprise a plurality of holes that may be configured to control the passage of the activated gas (i.e., the ionic, radical, and/or neutral species) through distribution plate 123. For example, the aspect ratio of the holes (i.e., the hole diameter to length) and/or the geometry of the holes may be controlled so that the flow of ionically-charged species in the activated gas passing through distribution plate 123 is reduced. The holes in distribution plate 123 may include, for example, a cylindrical portion that faces top plate 114, and a tapered portion that faces dual-channel showerhead 118. The cylindrical portion may be shaped and dimensioned to control the flow of ionic species passing to dual-channel showerhead 118. An adjustable electrical bias may also be applied to distribution plate 123 as an additional implementation to control the flow of plasma, radical, and/or ionic species through distribution plate 123. Controlling the amount of ionic species, for example, passing through distribution plate 123 provides increased control over the activated gas brought into contact with the underlying region and/or substrate, which in turn increases control of cleaning and/or deposition characteristics of the gas mixture.

Plasma and/or radicals then pass through a plurality of holes 124 disposed in the dual-channel showerhead 118 to enter into a processing region 128. Dual-channel showerhead 118 further includes a plurality of openings 126 that are smaller in diameter than the plurality of holes 124.

The plurality of openings 126 are connected to an internal volume (not shown) that is not in fluid communication with the plurality of holes 124. At least two gas/radical sources 119, 121 (for supplying, for example, TSA and He) may be coupled to dual-channel showerhead 118. Dual-channel showerhead 118 may be heated or cooled. In one implementation, dual-channel showerhead 118 is heated to a temperature of about 100 degrees Celsius (° C.) to about 600° C. In another implementation, dual-channel showerhead 118 is cooled to a temperature of about 25° C. to about 75° C. One or more heating elements (not shown) and/or a cooling channel (not shown) may be embedded in dual-channel showerhead 118. Heating elements and cooling channel may be used to control the temperature of dual-channel showerhead 118 during operation. The heating elements may be any suitable heating elements, such as one or more resistive heating elements. The heating elements may be connected to one or more power sources (not shown). A cooling fluid may flow through the channel to cool dual-channel showerhead 118.

Processing chamber 102 may include lid assembly 112, a body 130 and a support assembly 132. Support assembly 132 may be at least partially disposed within body 130. Body 130 may include a slit valve opening 135 to provide access to the interior of processing chamber 102. Body 130 may include liner 134 that covers the internal surfaces of body 130. Liner 134 may include one or more apertures 136 and a pumping channel 138 formed therein that is in fluid communication with a vacuum system 140. Apertures 136 provide a flow path for gases into pumping channel 138, which provides an egress for the gases within the processing chamber 102. Alternatively, the apertures and the pumping channel may be disposed in the bottom of body 130, and the gases may be pumped out of processing chamber 102 from the bottom of body 130.

Vacuum system 140 may include a vacuum port 142, a valve 144 and a vacuum pump 146. Vacuum pump 146 is in fluid communication with pumping channel 138 via vacuum port 142. Apertures 136 allow pumping channel 138 to be in fluid communication with processing region 128 within body 130. Processing region 128 is defined by a lower surface 148 of dual-channel showerhead 118 and an upper surface 150 of support assembly 132, and processing region 128 is surrounded by liner 134.

Support assembly 132 may include a support member 152 to support a substrate (not shown) for processing within body 130. The substrate may be any standard size, such as, for example, 300 mm. Alternatively, the substrate may be larger than 300 mm, such as 450 mm or larger. Support member 152 may comprise AlN or aluminum depending on operating temperature. Support member 152 may be configured to chuck the substrate and the support member 152 may be an electrostatic chuck or a vacuum chuck.

Support member 152 may be coupled to a lift mechanism 154 through a shaft 156 which extends through a centrally-located opening 158 formed in a bottom surface of the body 130. Lift mechanism 154 may be flexibly sealed to body 130 by bellows 160 that prevents vacuum leakage from around the shaft 156. Lift mechanism 154 allows support member 152 to be moved vertically within body 130 between a process position and a lower, transfer position. The transfer position is slightly below the opening of slit valve 135. During operation, the spacing between the substrate and dual-channel showerhead 118 may be minimized in order to maximize plasma and/or radical flux at a substrate surface. For example, the spacing may be between about 100 mm and about 5,000 mm. Lift mechanism 154 may be configured to rotate shaft 156 via a rotor (not shown) coupled to support member 152, which in turn rotates support member 152, causing the substrate disposed on support member 152 to be rotated during operation. Rotation of the substrate helps improving surface deposition and cleaning uniformity.

One or more heating elements 162 and a cooling channel 164 may be embedded in the support member 152. Heating elements 162 and cooling channel 164 may be used to control the temperature of the substrate during operation. Heating elements 162 may be any suitable heating elements, such as one or more resistive heating elements. Heating elements 162 may be connected to one or more power sources (not shown). Heating elements 162 may be controlled individually to have independent heating and/or cooling control on multi-zone heating or cooling. With the ability to have independent control on multi-zone heating and cooling, the substrate temperature profile can be enhanced under various process conditions. A cooling fluid may flow through channel 164 to cool the substrate. Support member 152 may further include gas passages extending to upper surface 150 for flowing a cooling gas to the backside of the substrate.

Chamber 102 may comprise an RF source. An RF source may be coupled to either dual-channel showerhead 118 or support member 152. The RF source may be low frequency, high frequency, or very high frequency. In some implementations, dual-channel showerhead 118 is coupled to the RF source and support member 152 is grounded, as shown in FIG. 1. In some implementations, dual-channel showerhead 118 is grounded and support member 152 is coupled to the RF source. In either implementation, a capacitively coupled plasma may be formed in processing region 128 between dual-channel showerhead 118 and support member 152 during operation. The capacitively coupled plasma formed in processing region 128 may be in addition to the plasma formed in remote plasma source 104. Support member 152 may be biased with a DC source to increase activated gas bombardment. Thus, processing chamber 102 may be a PECVD/flowable CVD chamber, and the apparatus 100 is capable of performing cyclic processes (alternating radical based PECVD/CVD) and cyclic cleaning processes.

The above-described apparatus 100 can be controlled by a processor based system controller such as controller 190. For example, controller 190 may be configured to control flow of various cleaning gases, process gases and purge gases from gas sources during different stages of a cyclic cleaning process and/or deposition process sequence. Controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of a processing system to facilitate control of the processes. Controller 190 also includes hardware for monitoring processes through sensors in the processing system 100, including sensors monitoring the cleaning gas flow, process gas flow and purge gas flow. Other sensors that measure system parameters such as temperature of one or more RPS and/or chamber surfaces, RPS and/or chamber atmosphere pressure and the like, may also provide information to controller 190.

To facilitate control of a processing system described above, CPU 192 may be one of any form of general purpose computer processor that can be used in an industrial setting, such as a programmable logic controller (PLC), for controlling various chambers and sub-processors. Memory 194 is coupled to CPU 192 and memory 194 is non-transitory and may be one or more of readily available memory such as random access memory (RAM), read only memory (ROM), floppy disk drive, hard disk, or any other form of digital storage, local or remote. Support circuits 196 are coupled to CPU 192 for supporting the processor in a conventional manner. Cleaning, deposition, etching, seasoning and other processes are generally stored in the memory 194, typically as a software routine. The software routine may also be stored and/or executed by a second CPU (not shown) that is remotely located from the hardware being controlled by CPU 192.

Memory 194 is in the form of computer-readable storage media that contains instructions, that when executed by CPU 192, facilitates the operation of the processing system. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the implementations (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are implementations of the present disclosure.

Deposition processes, cyclic cleaning processes, and/or seasoning processes of the present disclosure may be carried out using a high-density plasma CVD system, a plasma enhanced CVD system, and/or a sub-atmospheric CVD system, among other systems. Examples of CVD systems capable of deposition processes, cyclic cleaning processes, and/or seasoning processes of the present disclosure include the ULTIMA HDP CVD® system and ETERNA CVD® on the PRODUCER® system, both available from Applied Materials, Inc., of Santa Clara, Calif. Other suitably configured CVD systems from other manufacturers may also be used. Implementations of the present disclosure are not limited to performance using a flowable CVD apparatus, but include any suitable CVD apparatus. A remote plasma source, such as remote plasma source 104, may be used on a wide array of CVD chambers, and is similarly not limited to flowable CVD apparatus.

Figure 2:
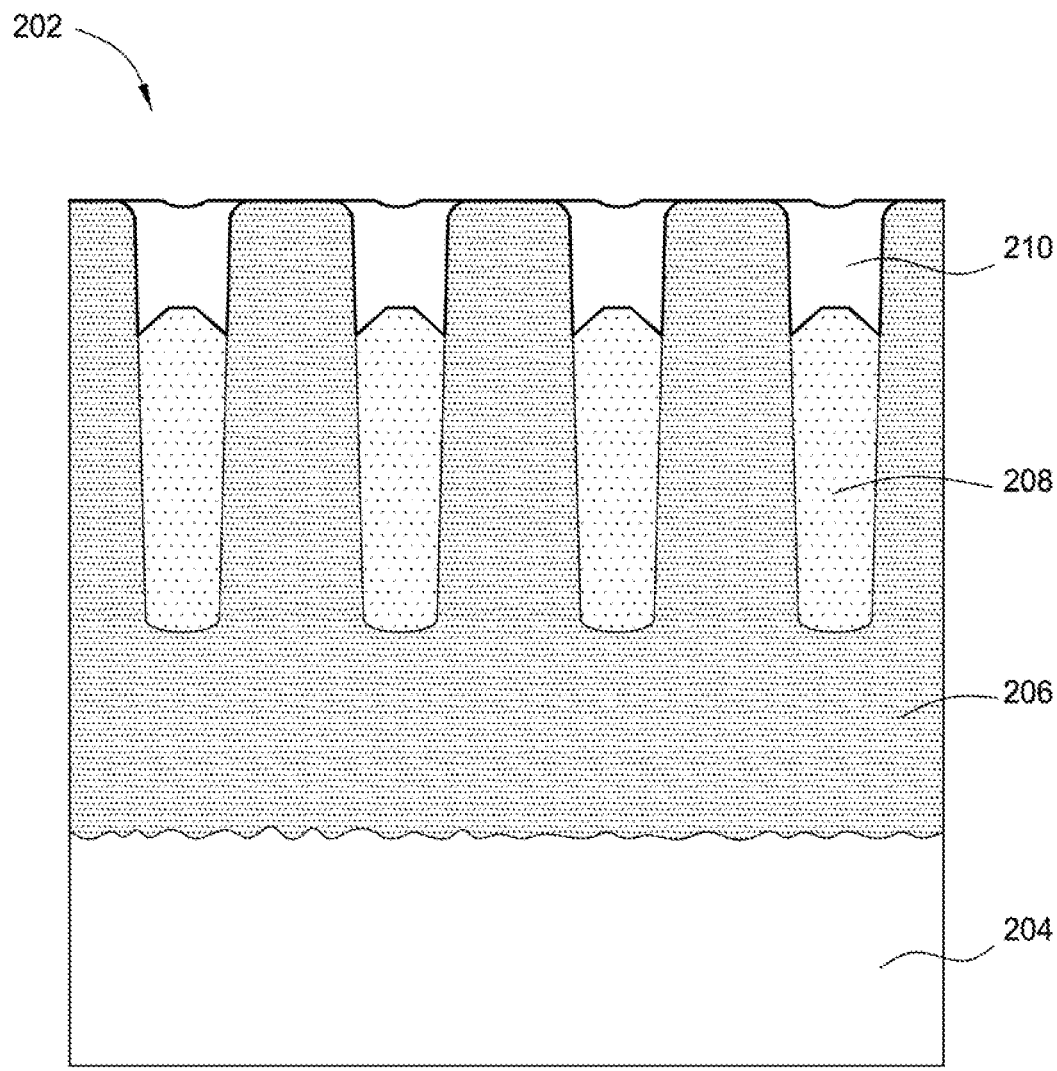
FIG. 2 is a schematic illustration of an internal surface of an RPS according to some implementations.

Defects, such as aluminum fluoride-based defects, have been a hindrance to CVD efficiency for quite some time, yet the source of the defects, e.g. which chamber components the Al—F and/or Al—O—F originate from, has not been discovered. FIG. 2 is a schematic illustration of an internal surface of an RPS, such as remote plasma source 104, according to some implementations. As shown in FIG. 2, an RPS internal surface 202 comprising an aluminum base layer 204 has a barrier layer 206, e.g. an anodic coating such as $Al_2O_3$, and a sealing material 208 covering a plurality of anodic pores 210. Anodic coatings are typically formed in an electrolytic solution, such as sulfuric acid ($H_2SO_4$). A resulting barrier layer (and perhaps base layer) of an RPS contains residual sulfur content. An energy dispersive X-ray spectrometer (EDX) is a tool that allows determination of the identity of defects of an apparatus/chamber that contain sulfur, and therefore allow determination of whether defects originate in the RPS. A scanning electron microscope (SEM) is a tool that allows determination of the quantity of the defects of an apparatus/chamber that contain sulfur (e.g., after identification with EDX). Hence, the combination of use of these tools allows determination of the extent of Al—F and Al—O—F defect formation after a cleaning process due to detection of residual sulfur. An auger electron spectrometer (AES) may be used instead of or in addition to SEM to determine quantity of defects. During a cleaning process, defects, such as Al—F and Al—O—F, can be identified and the number of defects originating from the RPS can be determined.

Figure 3:
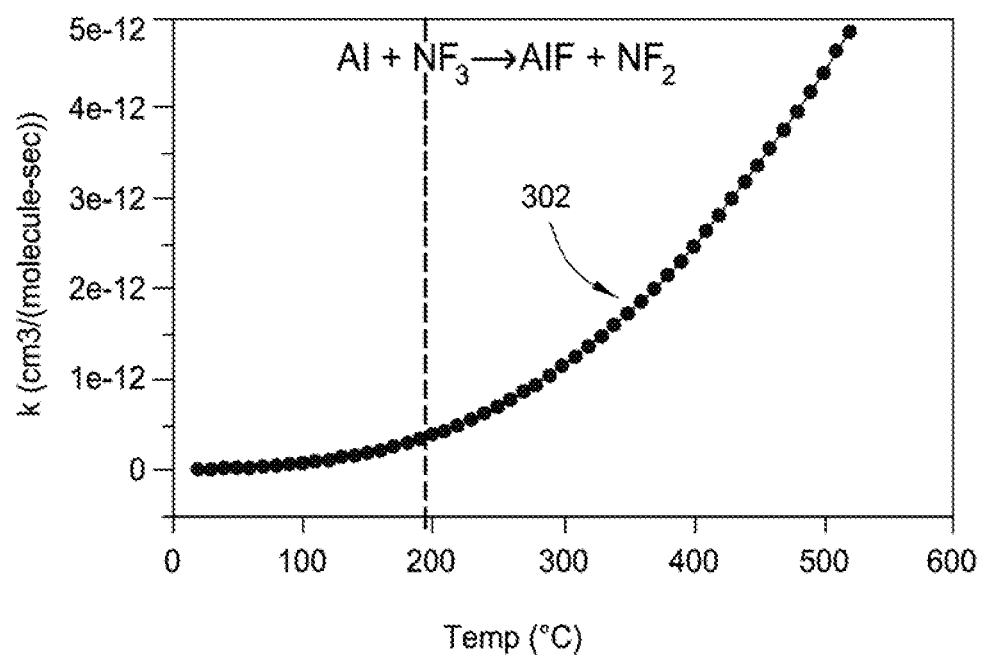
FIG. 3 illustrates the Arrhenius behavior of aluminum reacting with $NF_3$.

FIG. 3 illustrates the Arrhenius behavior of aluminum reacting with $NF_3$ to form Al—F and $NF_2$. As shown in FIG. 3, Al—F defect formation rises steadily between about 150° C. and 200° C. and rises exponentially above 200° C., as indicated by line 302. In fact, Al—F formation increases 6-fold as reaction temperature is increased from 100° C. to 200° C. Thus, an RPS cleaning process where the RPS has an aluminum base material and/or non-resilient barrier layer should be maintained at a temperature below about 150° C. to reduce or eliminate defect formation, such as between about 40° C. and about 150° C., such as between about 75° C. and about 120° C., such as about 75° C. and about 100° C. However, continuous cleaning processes typically reach temperatures within an RPS of above 200° C. Indeed, often times a majority of the defects present in a chamber are the result of a continuous cleaning process of the RPS.

Figure 4:
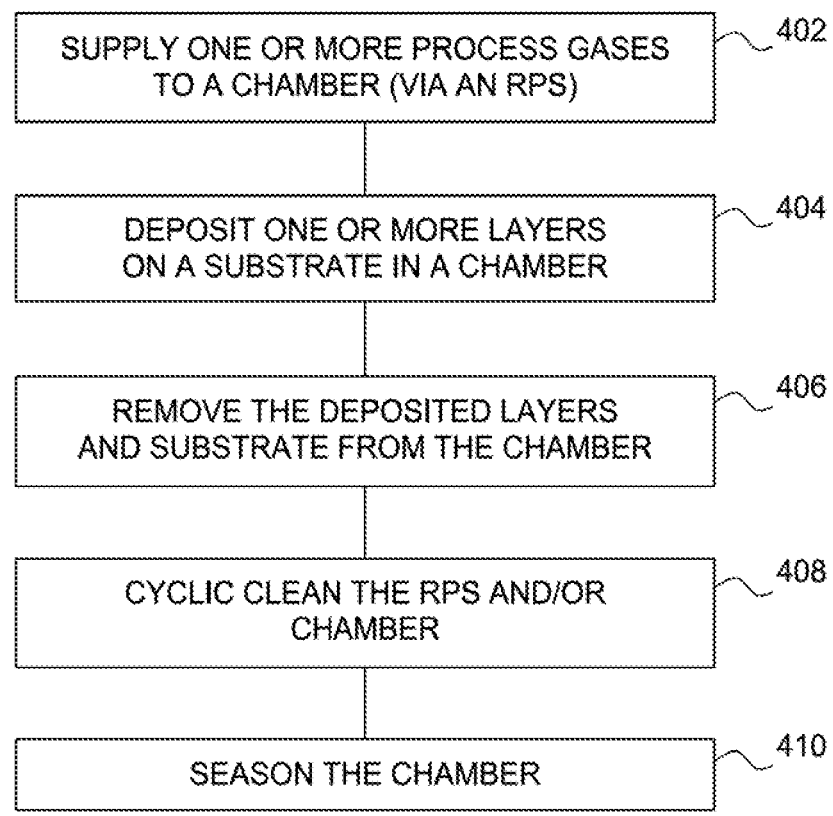
FIG. 4 is a process flow diagram illustrating a method according to some implementations.

FIG. 4 is a process flow diagram illustrating a method according to some implementations. As shown in FIG. 4, block 402 includes supplying one or more process gases to a chamber, optionally via a remote plasma source. Block 404 includes depositing one or more layers onto a substrate in a chamber, such as chamber 102 of apparatus 100. The deposited layer(s) on the substrate are all removed from the chamber, as shown in block 406. A cyclic cleaning of the remote plasma source and/or chamber is performed at block 408. In some implementations, cyclic cleaning is performed as an in-situ cleaning during the depositing one or more layers onto a substrate in the chamber of block 404. After cyclic cleaning, the chamber and/or RPS may be seasoned, as shown at block 410, and the process of FIG. 2 may be optionally repeated.

In some implementations, one cycle of a cyclic cleaning (such as block 408) includes supplying one or more cleaning gases, such as $NF_3$, followed by supplying one or more purge gases, such as argon, to an RPS. In other implementations, one cycle of a cyclic cleaning (such as block 408) includes supplying a gas mixture containing one or more cleaning gases and one or more purge gases, and increasing the ratio of purge gas to cleaning gas as a particular cycle comes to an end. In some implementations, one cycle of a cyclic cleaning (such as block 408) includes supplying one or more cleaning gases followed by vacuum evacuation of the RPS and/or chamber as a particular cycle comes to an end. At the beginning of a subsequent cycle, one or more cleaning gases are reintroduced into the RPS.

One or more cleaning gases may be introduced into the RPS at a flow rate from about 0.1 standard cubic centimeters per minute (sccm) and about 50,000 sccm for a 300 mm substrate, such as between about 1 sccm and about 10,000 sccm. If used, the flow rate of one or more purge gases into an RPS may range from about 0.1 sccm and about 50,000 sccm for a 300 mm substrate, such as between about 1 sccm and about 10,000 sccm. Cleaning gases include $NH_3$, $NF_3$, $O_2$, $O_3$, $H_2O$, hydrogen peroxide, $F_2$, NO, $NO_2$, $N_2O$, $H_2$, $SF_6$ and fluorocarbons, such as $CHF_3$, $CF_4$, $C_4F_6$, $C_3F_8$ and $C_5F_8$. Purge gases include Ar, He, and $N_2$.

Figure 5:
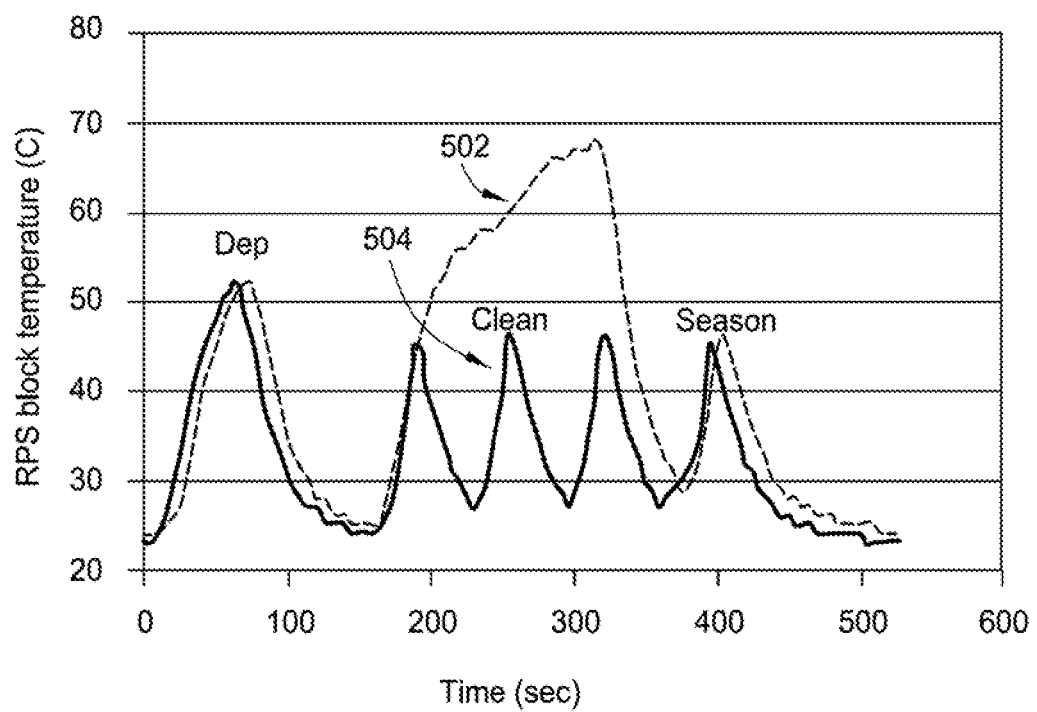
FIG. 5 illustrates RPS block temperature during a continuous cleaning process and a cyclic cleaning process of an RPS coupled with a CVD chamber.

FIG. 5 illustrates RPS block temperature during a continuous cleaning process and a cyclic cleaning process of an RPS coupled with a CVD chamber. As shown in FIG. 5, process 502 is a deposition (such as block 404), continuous clean, and seasoning (such as block 410), and process 504 is a deposition (such as block 404), cyclic clean (such as block 408), and seasoning (such as block 410). Temperatures within an RPS will be higher than temperatures of the RPS block during process 502 and process 504, yet measuring RPS block temperature during these processes is a good indication of relative temperatures within the RPS during various stages of the processes. RPS block temperature for process 502 and process 504 rises to above 50° C. during deposition and to about 45° C. during seasoning.

The continuous cleaning of an RPS of process 502 involves flowing $NF_3$, $NH_3$, $O_2$, and Ar gas mixture into an RPS (coupled with a CVD chamber). The continuous cleaning of process 502 is carried out for about 200 seconds to about 250 seconds, at which time the ratio of Ar gas to other gases ($NF_3$, $NH_3$, and $O_2$) is substantially increased and $NF_3$, $NH_3$, and $O_2$ is phased out from the RPS. RPS block temperature during the continuous cleaning of the RPS for process 502 rises from about 25° C. to nearly 70° C., yielding a ΔT of 45° C. The actual temperature within the RPS during the continuous cleaning of process 502 is greater than 70° C., such as about 200° C. Accordingly, ΔT within the RPS during the continuous clean of process 502 is greater than 45° C.

The cyclic cleaning of an RPS of process 504 involves flowing $NF_3$, $NH_3$, $O_2$, and Ar gas mixture into an RPS (coupled with a CVD chamber). The cyclic cleaning of process 504 includes three cycles. Each cycle is carried out for about 75 seconds, at which time the ratio of Ar purge gas to cleaning gases (N $F_3$, $NH_3$, and $O_2$) is substantially increased and $NF_3$, $NH_3$, and $O_2$ is partially or substantially phased out from the RPS. For a subsequent cycle, the ratio of $NF_3$, $NH_3$, $O_2$ process gases to Ar is increased to reintroduce the cleaning gases into the RPS, and the cycle is repeated. At the end of the cyclic cleaning of process 504, the ratio of Ar gas to other gases ($NF_3$, $NH_3$, and $O_2$) is substantially increased and $NF_3$, $NH_3$, and $O_2$ is phased out from the RPS. RPS block temperature during the cyclic cleaning of the RPS for process 504 rises from about 25° C. to about 45° C. during each of the three cycles, yielding a ΔT of 20° C. for each cycle and the overall cyclic cleaning process. The lower peak temperature of each cycle of process 504 (as compared to the peak temperature of the continuous cleaning of process 502) as well as the reduced ΔT of the cyclic cleaning yields less thermal shock to the internal surface of the RPS, and accordingly less crazing and flaking of the internal surface, resulting in fewer defects within the CVD chamber. Less thermal shock (and fewer defects) also reduces plasma arcing in the RPS and RPS block.

Figure 6:
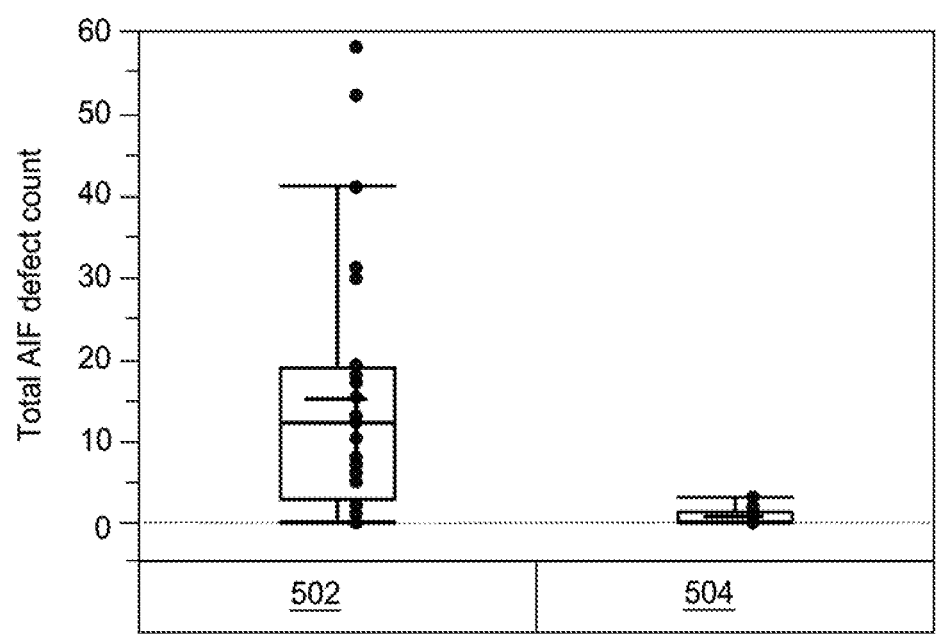
FIG. 6 illustrates total Al—F and Al—O—F defect counts of some cleaning processes according to some implementations.

Because of the lower peak temperature (and ΔT) of the remote plasma source during a cyclic cleaning (as compared to a continuous cleaning), the remote plasma source has a temperature profile that is a cyclic steady state, where the RPS experiences less thermal shock impact on an internal surface layer of the RPS and less defect formation within the remote plasma source and the CVD chamber. FIG. 6 illustrates total Al—F/Al—O—F defect counts (as determined by EDX and SEM) of the respective cleaning of process 502 and process 504. As shown in FIG. 6, continuous cleaning of process 502 typically yields from 5 to 20 total Al—F/Al—O—F defects, whereas cyclic cleaning of process 504 yields from 1 to 3 total Al—F/Al—O—F defects, achieving Al—F/Al—O—F defect reduction by at least 50%. In at least one implementation of the present disclosure, cyclic cleaning yields less than about 1 Al—F/Al—O—F defect. Furthermore, there is no reduction in the rate of overall cleaning time or reduction in the extent of cleaning of chamber components, such as RPS, using cyclic cleaning (such as block 408) of process 504.

In some implementations, a cyclic cleaning (such as block 408) is performed such that an internal surface of the remote plasma source is maintained at a temperature below about 150° C., such as below about 100° C., during a cyclic clean, and the change in temperature (ΔT) of the remote plasma source block during the cyclic cleaning may be between about 10° C. and about 40° C., such as about 10° C. and about 25° C. During a cycle of cyclic cleaning, a block of a remote plasma source may reach a peak temperature that is below about 70° C., such as between about 10° C. and about 60° C., such as about 20° C. and about 50° C. The number of cycles of cyclic cleaning described herein may be between about 2 cycles and about 15 cycles, such as about 3 cycles and about 6 cycles. A higher number of cycles may decrease peak temperature (and ΔT) of each cycle and an overall cyclic cleaning but a higher number of cycles may also decrease throughput of processing. A preferred number of cycles for cyclic cleaning is a number where peak temperature (and ΔT) are sufficiently low to reduce or eliminate defect formation but throughput will nonetheless remain sufficiently high. In some implementations, each cycle has a duration between about 5 seconds and about 120 seconds, such as about 20 seconds and about 90 seconds, such as about 50 seconds and about 75 seconds.

In some implementations, during a cyclic cleaning (such as block 408), a cooling fluid is supplied to one or more conduits, such as cooling conduits 168, coupled with an RPS. Cooling fluid, such as water, supplied from a cooling fluid source, such as cooling fluid source 172, assists in temperature regulation of an RPS and helps a cyclic cleaning to reach a cyclic steady state of temperature, as described above. In some implementations, a flow rate of cooling fluid through conduit(s) of the remote plasma source is between about 3 liters per minute (LPM) and about 15 LPM, such as about 4 LPM and about 5 LPM, for example about 4.5 LPM, such as between about 1 gallon per minute (GPM) and about 5 GPM, for example about 3 GPM. A temperature of cooling fluid entering a first end of conduit(s) (coupled with the remote plasma source) may be between about 10° C. and about 30° C., such as between about 20° C. and about 25° C., for example 21.4° C.

A temperature of cooling fluid exiting the second end of the conduit(s) may be between about 10° C. and about 25° C., such as between about 20° C. and about 23° C., for example 22.6° C. or 22.8° C. A supply pressure of cooling fluid entering a first end of conduit(s) to the RPS may be between about 20 pounds per square inch (PSI) and about 100 psi, such as between about 40 PSI and about 50 PSI. Temperature of cooling fluid and supply pressure may each be adjusted such that a desired RPS temperature (and cyclic steady state) is accomplished. In some implementations, doubling the flow rate of cooling fluid from 3 LPM to 15 LPM or from 1 GPM to 5 GPM reduces RPS block temperature by about 80%.

While the cyclic cleaning of process 504 involves an anodized aluminum internal surface of an RPS, such as anodized $Al_2O_3$, cyclic cleaning of methods described herein is applicable for any suitable internal RPS surface, such as AlN, $SiO_2$, $Y_2O_3$, MgO, sapphire, and ceramic containing one or more of $Al_2O_3$, sapphire, AlN, $Y_2O_3$, MgO, or plastic. Furthermore, while the cyclic cleaning of process 504 illustrates each cycle reaching the same peak temperature, implementations of the present disclosure include cyclic cleaning where two or more cycles have different peak temperatures.

Following a cyclic clean, the RPS and/or CVD chamber may be seasoned (such as block 410) using any suitable seasoning process. Seasoning the RPS and/or CVD chamber (such as block 410) may include flowing a silicon-containing precursor into a remote plasma source to deposit a silicon containing film on an internal surface of the chamber and, in some implementations, the remote plasma source. Seasoning may prevent fluorine adsorption and provide protection against other contaminants within the chamber walls (e.g., the diffusion of metal fluorides). Such seasoning may include depositing a thin silicon oxide layer over the chamber walls before a substrate is introduced into the chamber for processing. The deposited silicon oxide layer covers the chamber walls, reducing the likelihood that contaminants will interfere with subsequent processing steps, such as one or more deposition processes. After deposition of the seasoning layer is complete, the chamber may be used for 1 to n substrate deposition processes before being cleaned by another cyclic cleaning process (such as block 408) as described above and then optionally re-seasoned (such as block 410).

The dielectric properties of the seasoning layer also provide an insulating barrier that prevents electrical arcing between the plasma and the walls of the chambers. Chambers typically include conductive materials (e.g., metals), and when the electric potential of the plasma exceeds a threshold level it begins to ground itself by discharging through the exposed conductive surfaces of the chamber. This discharging can damage the chamber by ablating away parts of the conductive surface. Coating these exposed conductive surfaces with the seasoning film further reduces (or prevents) plasma arcing in addition to cyclic clean (such as block 408).

A seasoning film also traps defect particles adhered to chamber walls preventing them from falling onto a substrate (and the films deposited on the substrate) during a deposition process (such as block 404). Seasoning films may be formed from a seasoning gas that includes oxygen ($O_2$) and silane ($SiH_4$) flowing into the chamber in a ratio of about 1.4 to 1 or less. A pre-heating step of 15 seconds or less may be performed prior to the introduction of the seasoning gas. In some implementations, a pre-heating step of about 30 seconds or longer is performed and the oxygen to silane ratio in a seasoning gas is increased to about 1.6 to 1 or more. The resulting seasoning films formed on the chamber components have less flaking and generate fewer defects than conventional seasoning films.

A seasoning layer may be deposited on internal surface(s) of one or more chamber walls by forming a plasma from a gas that includes silane ($SiH_4$), oxygen ($O_2$) and argon (Ar). The plasma is formed by application of RF energy. In some implementations, the plasma is not biased towards the substrate.

During seasoning, a number of seasoning film deposition parameters may be considered that assist the seasoning film in adhering to internal surface(s) of the one or more chamber walls and, in some implementations, internal surface(s) of RPS. These deposition parameters may include: temperature, pressure, RF power level (or levels), the argon to oxygen ratio, and the oxygen to silane ratio, among other parameters. Controlling the oxygen to silane ratio has an effect on the composition of the seasoning film, which affects the ability of the film to adhere to the internal surfaces. While not being bound by theory, an overly silicon rich seasoning film resulting from too low an oxygen to silane ratio forms a film with too many Si—H bonds and poor chamber wall adhesion characteristics. An overly oxygen rich seasoning film resulting from too high an oxygen to silane ratio forms a film with too many Si—OH bonds, which also has poor chamber wall adhesion characteristics.

In some implementations, a seasoning film formed with an oxygen to silane ratio from about 1.6:1 to about 2.4:1 has good adhesion characteristics for chamber components made from silicon nitride (e.g., nozzles, baffles, etc.) compared with other seasoning films made with and oxygen to silane ratio of 1.4:1 or lower. Other implementations include forming a seasoning film with an oxygen to silane ratio from about 1.6:1 to about 2.2:1.

In some implementations, the amount of gases other than oxygen and silane are also controlled when used for seasoning. For example, gases such as argon, helium and/or hydrogen may accompany the oxygen and silane into an RPS and/or chamber to form a seasoning film. The relative amounts of these gases may also affect the adhesion characteristics of the seasoning film. Increasing argon flow, for example, increases plasma density, which can make a more effective seasoning film. However, too much argon may increase the chamber pressure so that plasma density is reduced rather than increased, decreasing the effectiveness of a seasoning film. In some implementations, an argon flow rate is set about equal to the silane flow rate.

In some implementations, forming a seasoning gas includes flowing 290 sccm—of oxygen ($O_2$), 180 sccm of silane ($SiH_4$), and 110 sccm of argon into an RPS and/or chamber. A plasma may be struck for about 25 seconds to form a seasoning film on the interior of the chamber and, in some implementations, internal surface(s) of the RPS. Prior to depositing the seasoning film, an about 30 second heat-up step may be performed. The heat-up step may include striking a plasma from oxygen and argon using RF power of between about 3000 watts and about 5000 watts. In some implementations, a heating process includes striking and maintaining a plasma for 45 to 60 seconds with an RF power of about 4800 watts. The plasma may be formed from oxygen ($O_2$) and argon.

In some implementations, after a heat-up period, a seasoning film is formed by flowing 350 sccm of oxygen ($O_2$), 160 sccm of silane ($SiH_4$), and 110 sccm of argon into an RPS/chamber. A plasma may be struck for about 25 seconds to form a seasoning film on the interior of the chamber.

Overall, methods, such as cyclic cleaning methods, described herein provide RPS having a temperature profile that is a cyclic steady state, where the RPS experiences reduced thermal shock impact on an internal surface layer of the RPS and reduced defect formation within the RPS and the CVD chamber. Cyclic cleaning methods described herein provide lower peak temperature of each cycle, as compared to the peak temperature of a continuous cleaning process, as well as reduced $\Delta T$, both of which provide less thermal shock to the internal surface of an RPS, and less crazing and flaking of the internal surface, resulting in fewer defects within a CVD chamber. In some implementations, methods described herein provide RPS and/or chamber defect reduction of 50% or greater. Furthermore, there is no reduction in the rate of overall cleaning time or reduction in the extent of cleaning of chamber components, such as RPS, using cyclic cleaning, as compared to a continuous cleaning. Furthermore, the reduced thermal shock (and reduced severity and number of defects) also reduces plasma arcing in the RPS and RPS block.

While the foregoing is directed to implementations of the present disclosure, other and further implementations of the present disclosure may be devised without departing from the basic scope thereof, and the scope thereof is determined by the claims that follow.

We claim:
1. A method of cleaning a remote plasma source coupled with a chamber, comprising:
 a) supplying one or more process gases through a remote plasma source to an inner volume of a chamber to perform a process on a substrate disposed in the inner volume during a process time interval;
 b) supplying one or more first cleaning gases to the remote plasma source coupled with the chamber during a first time interval of a first cleaning process;
 c) supplying, during a second time interval of the first cleaning process, one or more purge gases to the remote plasma source to reduce levels of the one or more cleaning gases in the remote plasma source, wherein the second time interval occurs after the first time interval; and
 d) supplying one or more second cleaning gases to the remote plasma source during a third time interval of the first cleaning process, wherein
 the third time interval occurs after the second time interval,
 a temperature of an interior surface of the remote plasma source at an end of each of the first time interval and the third time interval is higher than the temperature of the interior surface of the remote plasma source at an end of the second time interval,
 a peak temperature of the interior surface of the remote plasma source during each of the first time interval and the third time interval is lower than a peak temperature of the interior surface of the remote plasma source during the process time interval,
 a plasma of the corresponding gases supplied to the remote plasma source is initiated in the remote plasma source during each of the process time interval, the first time interval, and the third time interval, and
 the plasma initiated during the first time interval is a next plasma initiated in the remote plasma source after the plasma initiated in the remote plasma source during the process time interval.

2. The method of claim 1, wherein the interior surface of the remote plasma source has a temperature between about 40° C. and about 150° C. during the first time interval and the third time interval.

3. The method of claim 2, wherein the interior surface of the remote plasma source has a temperature between about 75° C. and about 100° C. during the first time interval and the third time interval.

4. The method of claim 1, wherein
the first time interval and the second time interval form a first cycle of the first cleaning process, and
a ratio of the one or more purge gases to the one or more first cleaning gases is increased from a beginning of the first cycle to an end of the first cycle.

5. The method of claim 1, further comprising:
evacuating the remote plasma source between the first time interval and the third time interval; and
evacuating the remote plasma source after the third time interval.

6. The method of claim 1, wherein each of the one or more first cleaning gases and the one or more second cleaning gases is independently selected from the group consisting of $NH_3$, $NF_3$, $O_2$, $O_3$, $H_2O$, hydrogen peroxide, $F_2$, NO, $NO_2$, $N_2O$, $H_2$, $SF_6$, $CHF_3$, $CF_4$, $C_4F_6$, $C_3F_8$ and $C_5F_8$.

7. The method of claim 1, wherein a flow rate of the one or more first cleaning gases to the remote plasma source is between about 0.1 sccm and about 50,000 sccm, and wherein a flow rate of the one or more second cleaning gases to the remote plasma source is between about 0.1 sccm and about 50,000 sccm.

8. The method of claim 1, wherein
a combined duration of the first time interval and the second time interval is between about 20 seconds and about 90 seconds.

9. The method of claim 1, wherein a peak temperature of the remote plasma source during the first time interval is different than a peak temperature of the remote plasma source during the third time interval.

10. The method of claim 1, wherein a peak temperature of the remote plasma source during the first time interval is substantially the same as a peak temperature of the remote plasma source during the third time interval.

11. The method of claim 1, wherein a peak temperature of the remote plasma source during the first time interval is between about 20° C. and about 60° C., and wherein a peak temperature of the remote plasma source during the third time interval is between about 20° C. and about 60° C.

12. The method of claim 1, wherein the remote plasma source during the first time interval has a ΔT of between about 10° C. and about 40° C., and wherein the remote plasma source during the third time interval has a ΔT of between about 10° C. and about 40° C.

13. The method of claim 1, further comprising repeating b) and c) between about 1 and about 15 times.

14. The method of claim 1, wherein an internal surface of the remote plasma source is a material selected from the group consisting of anodized $Al_2O_3$, AlN, $SiO_2$, $Y_2O_3$, MgO, sapphire, and ceramic containing one or more of $Al_2O_3$, sapphire, AlN, $Y_2O_3$, MgO, or plastic.

15. The method of claim 1, wherein the first time interval, the second time interval, and the third time interval are consecutive.

16. The method of claim 1 further comprising:
seasoning the remote plasma source by flowing a silicon-containing precursor gas into the remote plasma source to deposit a silicon-containing film on an interior surface of the remote plasma source.

17. A method of cleaning a remote plasma source, comprising:
supplying one or more process gases through a remote plasma source to an inner volume of a chamber to perform a process on a substrate disposed in the inner volume during a process time interval;
supplying one or more first cleaning gases to the remote plasma source during a first time interval of a first cleaning process;
supplying, during a second time interval of the first cleaning process, one or more purge gases to the remote plasma source to reduce levels of the one or more cleaning gases in the remote plasma source, wherein the second time interval occurs after the first time interval;
supplying one or more second cleaning gases to the remote plasma source during a third time interval of the first cleaning process, wherein
the third time interval occurs after the second time interval,
a temperature of an interior surface of the remote plasma source at an end of each of the first time interval and the third time interval is higher than the temperature of the interior surface of the remote plasma source at an end of the second time interval
a peak temperature of the interior surface of the remote plasma source during each of the first time interval and the third time interval is lower than a peak temperature of the interior surface of the remote plasma source during the process time interval,
a plasma of the corresponding gases supplied to the remote plasma source is initiated in the remote plasma source during each of the process time interval, the first time interval, and the third time interval, and
the plasma initiated during the first time interval is a next plasma initiated in the remote plasma source after the plasma initiated in the remote plasma source during the process time interval; and
supplying one or more cooling fluids to one or more cooling conduits coupled with the remote plasma source during the first cleaning process.

18. The method of claim 17, wherein a flow rate of cooling fluid through the one or more conduits is between about 1 GPM to about 5 GPM.

19. The method of claim 17, wherein a temperature of the one or more cooling fluids at a first end of the one or more conduits is between about 10° C. and about 30° C., and wherein a supply pressure of the cooling fluid at a first end of the one or more conduits is between about 20 PSI and about 100 PSI.

20. The method of claim 17 further comprising:
seasoning the remote plasma source by flowing a silicon-containing precursor gas into the remote plasma source to deposit a silicon-containing film on an interior surface of the remote plasma source.

* * * * *

UNITED STATES PATENT AND TRADEMARK OFFICE
CERTIFICATE OF CORRECTION

PATENT NO. : 10,755,903 B2  Page 1 of 1
APPLICATION NO. : 15/397883
DATED : August 25, 2020
INVENTOR(S) : Sidharth Bhatia et al.

It is certified that error appears in the above-identified patent and that said Letters Patent is hereby corrected as shown below:

In the Specification

In Column 4, Line 6, delete "$O_4F_6$," and insert -- $C_4F_6$, --, therefor.

In Column 4, Lines 15-16, delete "hexamethyl-disilane" and insert -- hexamethyldisilane --, therefor.

In Column 4, Lines 22-23, delete "methyltrimethoxy-silane" and insert -- methyltrimethoxysilane --, therefor.

In Column 4, Line 24, delete "$((Me)_2$" and insert -- $(((Me)_2$ --, therefor.

In Column 10, Line 47, delete "$(N\ F_3$," and insert -- $(NF_3$, --, therefor.

Signed and Sealed this
Twenty-seventh Day of October, 2020

Andrei Iancu
*Director of the United States Patent and Trademark Office*